April 18, 1967 G. YANISHEVSKY 3,315,120
DIFFERENTIAL DELAY-LINE AMPLIFIER
Filed July 2, 1964

INVENTOR.
GILBERT YANISHEVSKY
BY Vincent L. Carney
ATTORNEY 3,315,120

DIFFERENTIAL DELAY-LINE AMPLIFIER

Gilbert Yanishevsky, Philadelphia, Pa., assignor to Burroughs Corporation, Detroit, Mich., a corporation of Michigan Filed July 2, 1964, Ser. No. 379,934
6 Claims. (Cl. 315—22)

Figure 1:
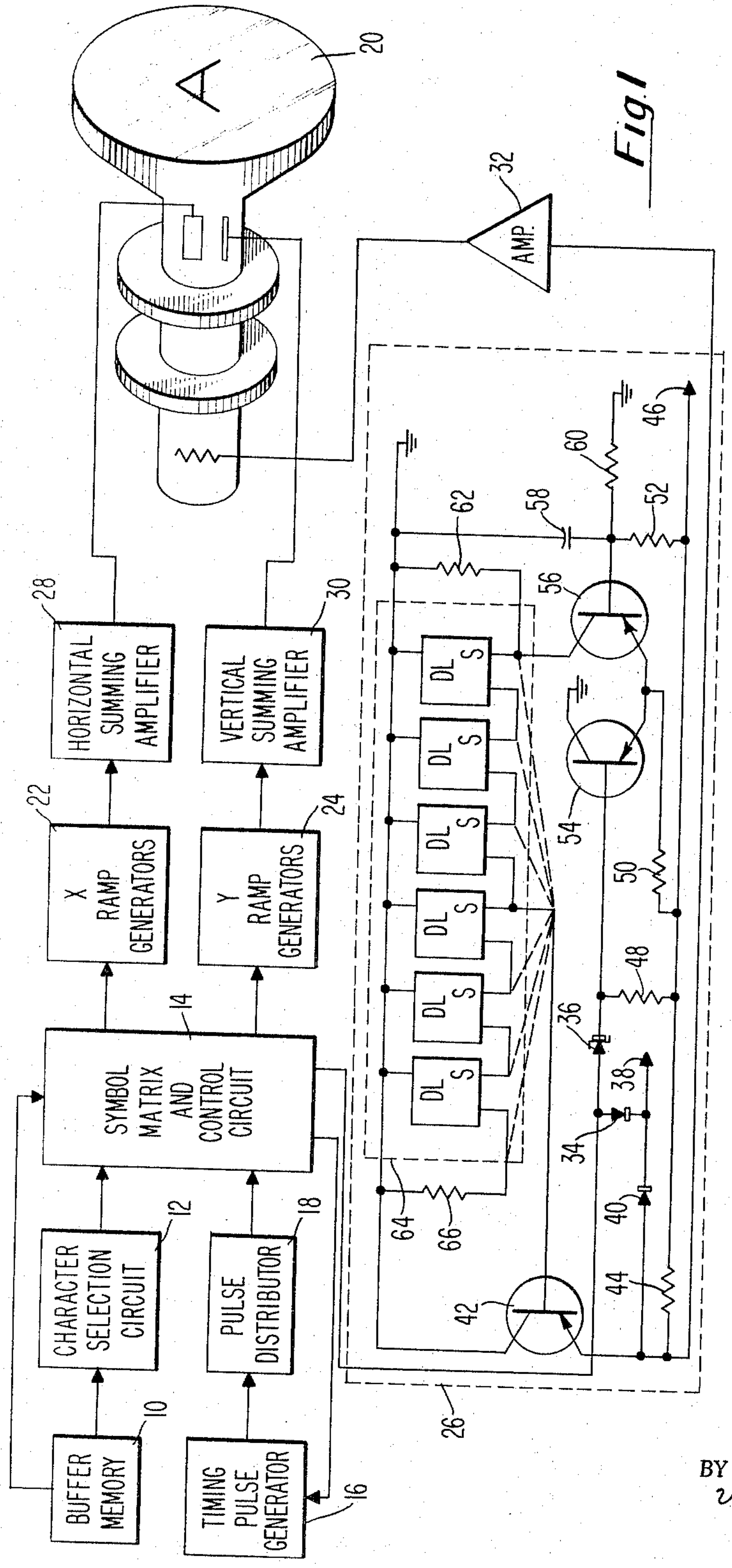

This invention relates to amplifiers, and more particularly, relates to improvements in amplifiers for driving delay lines.

Delay lines have found wide application in the electronic industries. They are particularly useful in timing circuits since they enable one electronic pulse to activate a series of events at different times. For example, a signal may open a gate and then pass through the gate. This is done by connecting the signal first to the control of the gate and then passing the signal through a delay line and into the gate. Also a plurality of signals may be timed with respect to each other by passing them through delay lines having different periods of delay.

Delay lines are generally driven by an amplifier. It is desirable that these amplifiers be simple and economical. Often, they must operate rapidly and be relatively noise-free. To achieve standardization and economy of design, it is desirable for a delay line amplifier to be easily adaptable for different delay lines, different input signals, different output-voltage levels, and different polarities of output voltages. These features of delay lines and delay-line amplifiers are of importance in character generators to time the drawing of lines and the blanking of cathode ray tube retrace.

Accordingly, it is an object of this invention to provide an improved delay-line amplifier.

It is another object of this invention to provide a delay-line amplifier of simple design which may operate rapidly and be relatively free from noise.

It is a still further object of this invention to provide a delay-line amplifier which may simultaneously drive more than one delay line.

It is a still further object of this invention to provide a delay-line amplifier which is easily adaptable to different delay lines, different types of input and output signals, and different polarities of signals.

In accordance with the above objects a transistor differential amplifier is provided in which the output voltage is adjusted by a potentiometer that is connected between the power supply and the emitters of both transistors. Delay lines are connected to the collectors of each of the two transistors. The delay lines are terminated in their characteristic impedance at both ends to prevent reflections. The transistors are biased so that switching occurs after a wide voltage swing on the base of the transistors so as to provide noise immunity.

Figure 2:
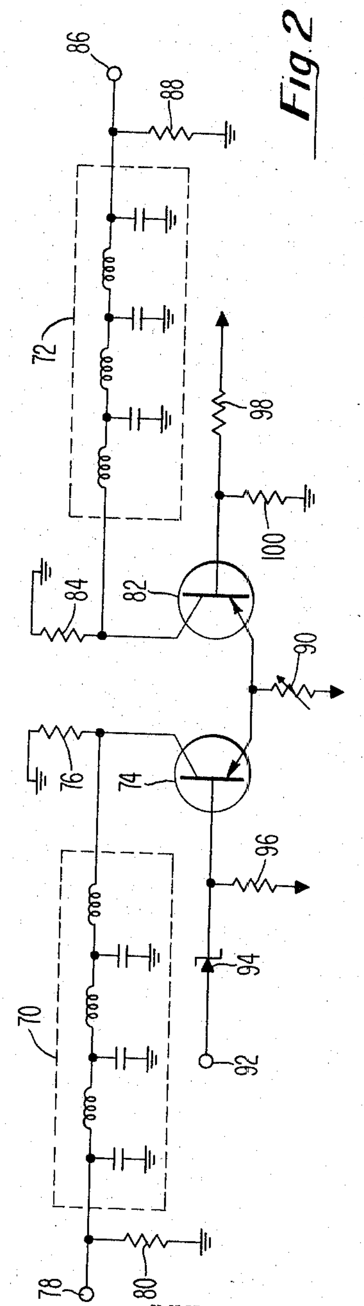

The above-mentioned features and other objects of the invention will be understood more clearly and fully from the following detailed description considered with reference to the accompanying drawings in which:

FIGURE 1 is a block diagram of a character generator showing, schematically, the delay-line amplifier of this invention in one embodiment; and FIGURE 2 is a schematic circuit diagram of another embodiment of the invention.

In FIGURE 1 there is shown a block diagram of a character generator of the type which is more fully described in the copending application to Charles P. Halsted, Ser. No. 277,796, filed May 3, 1963, and assigned to the same assignee as this application. In this character generator a buffer memory 10 is electrically connected to the character selection circuit 12 and to a symbol matrix and control circuit 14. A timing-pulse generator 16 is electrically connected to the pulse distributor 18.

The character selection circuit 12 is electrically connected to the symbol matrix and control circuit 14.

In response to signals from the buffer memory 10, the character selection circuit 12 selects an individual character to be read out on a cathode ray tube 20. The buffer memory 10 causes this character to be displayed on the cathode ray tube repeatedly until another character is desired. The information on the buffer memory comes from the computer (not shown).

The symbol matrix and control circuit 14 is also electrically connected to the timing-pulse generator 16, to X ramp generators 22, Y ramp generators 24, and to the delay line unit indicated generally as 26. When a character has been selected by the character selection circuit 12 to be read out by the symbol matrix and control circuit 14, the timing-pulse generator 16 sends pulses to the pulse distributor 18. The pulse distributor 18 steps from position to position in the symbol matrix.

Each position represents one line of the character to be drawn on the cathode ray tube 20. Each time the pulse distributor steps to a new position, the symbol matrix and control circuit 14 sends information to the X ramp generators 22 which is indicative of a horizontal deflection voltage for the cathode ray tube 20 and sends information to the Y ramp generator 24 which is indicative of a vertical deflection voltage for the cathode ray tube 20. These two deflection voltages acting together determine the slope of a line which is to be drawn on the cathode ray tube 20. One line is drawn for each position of a symbol matrix and control circuit under the control of the pulse distributor 18. The lines together form one character on the surface of the cathode ray tube 20. The outputs from the X ramp generators 22 are applied to the horizontal deflection plate of the cathode ray tube 20 through a horizontal summing amplifier 28 and the outputs from the Y ramp generators 24 are applied to the vertical deflection plates of the cathode ray tube 20 through the vertical summing amplifier 30.

At each position of the symbol matrix and control circuit 14, representing one line in a character, a signal is also sent to the timing-pulse generator 16. This information determines the time which elapses before the symbol matrix and control circuit 14 is to be stepped to a new position. When this time has elapsed, the timing-pulse generator 16 pulses the pulse distributor 18 so as to step to a new position in the memory matrices of the symbol matrix and control circuit 14. A new line having a new slope is started at this new position.

Three lines from the symbol matrix and control circuit 14 may, for example, be used to generate the letter A as shown on the face of the cathode ray tube 20. The first line may start at the lower left hand corner and may draw a straight line to the top of the letter A. The next line, represented by a new position in the symbol matrix and control circuit 14, may provide the down stroke at the right hand bottom edge of the letter A. Next, it is necessary to draw the cross-bar. In order to do this, the beam of the cathode ray tube must move to a new position without drawing a line. In moving this beam to its new position, the symbol matrix and control circuit 14 generates a blanking signal to prevent the retrace from appearing on the surface of the cathode ray tube. This signal is applied to the delay line unit 26. The delay is necessary to compensate for the greater delay in this X and Y line channels than in the blanking channel. It prevents premature blanking which would cause part of the retrace to be displayed and some of the preceding line segment to be blanked. While this line is being drawn, the blanking signal proceeds through the delay line and passes to the blanking amplifier 32. The output from the blanking amplifier 32 is electrically connected to the intensity control of the cathode ray tube 20 and reduces the intensity while the beam swings to its proper position to draw the cross-bar of the A.

The input to the delay line unit 26 is applied from the symbol matrix and control circuit 14 to the anode of the DS100029–3 Zener diode 34 and to the anode of the 1N762–2 diode 36. The cathode of the diode 34 is electrically connected to a source of a positive three volts 38 and to the cathode of the DS100029–3 diode 40. The anode of the diode 40 is electrically connected to the emitter of the PNP, 2N1495 transistor 42, to one end of the 6.8 kiloohm resistor 44 and to the input of the blanking amplifier 32. The diodes 34 and 40 clip the voltage inputs and outputs of the delay line unit and prevent them from exceeding a positive three volts.

A source of a positive fifteen volts 46 is electrically connected to one end of the 1.5 kiloohm resistor 48, to one end of the 430 ohm resistor 50, to one end of the 121 ohm resistor 52, and to the other end of the 6.8 kiloohm resistor 44. The other end of the resistor 48 is electrically connected to the cathode of the Zener diode 36 and to the base of a PNP 2N1495 transistor 54.

As the input swings from zero to a positive three volts, to the delay line unit, the base of the transistor 54 swings between a positive six and a positive nine volts. The collector of the transistor 54 is grounded.

The other end of the resistor 50 is electrically connected to the emitters of the two PNP, 2N1495 transistors 56 and 54; the other end of the resistor 52 is electrically connected to the base of transistor 56, to ground through a 0.1 microfarad capacitor 58, and to ground through a 121 ohm resistor 60. The base of the transistor 56 is biased at a positive 7.5 volts.

The collector of the transistor 56 is electrically connected to ground through the 510 ohm delay-line input resistor 62 and is connected to the input of the six unit delay line indicated generally as 64. The output unit of the delay line 64 is electrically connected to ground through the terminating 510 ohm resistor 66. The base of the buffer transistor 42 is electrically connected to the output of one of the units in the delay line and its collector is grounded.

The resistors 66 and 62 are the terminating and input resistors for the delay line 64 respectively. They prevent reflections and have a value equal to the characteristic impedance of the delay line. The buffer transistor 42 is turned off by the output from the delay line 64 so as to reduce the current flow through it from the positive voltage source 46 through the resistor 44. This provides a positive output voltage to the blanking amplifier 32, clipped at a positive three volts by the diode 40. The blanking voltage suppresses the retrace while the cathode ray beam moves to a new position on the face of the cathode ray tube.

In FIGURE 2 a schematic circuit diagram of another embodiment of the invention is shown having two delay lines indicated generally at 70 and 72. These delay lines are shown by inductors and capacitors in the usual manner. The delay line 70 is electrically connected at its input end to the collector of the PNP 2N711 transistor 74 and to ground through the resistor 76 and is electrically connected at its output end to the output terminal 78 and to ground through the resistor 80; the delay line 72 is electrically connected at its input end to the collector of the PNP, 2N711 transistor 82 and to ground through the resistor 84 and is electrically connected at its output end to the output terminal 86 and to ground through resistor 88. The resistances 80 and 76 have a value equal to the characteristic impedance of the delay line 70 and resistors 84 and 88 have a resistance equal to the characteristic impedance of the delay line 72.

If it is desirable to substitute different delay lines for either 70 or 72, it is only necessary to change the delay line and substitute new resistors for its terminating and input impedances. In this way, the delay lines may be changed without redesigning the amplifier. This results in great flexibility of operation.

The outputs from the delay lines 70 and 72 will be complementary for any one input to the amplifier. Consequently, complementary inputs may be used and the output taken from a different delay line. For example, instead of a normal input pulse rising from ground level to a positive three volts and falling back to ground level a pulse may be used which falls from a positive three volts to ground level and returns to a normal positive three volts again. Furthermore, the availability of two delay lines for one amplifier will sometimes result in an economy. The delay lines may be of different lengths.

A source of a positive fifteen volts is electrically connected to the emitters of the transistors 74 and 82 through the potentiometer 90. The magnitude of the output voltage from terminal 78 to 86 may be adjusted by adjusting the resistance of the potentiometer 90.

The input voltage is applied to input terminal 92 which is electrically connected to the anode of the six volt Zener diode 94. The cathode of the Zener diode is electrically connected to the base of the transistor 74 and to a source of a positive fifteen volts through the 4.3 kiloohm resistor 96. A source of a positive fifteen volts is electrically connected to the base of the transistor 82 through a 250 ohm resistor 98. The base of the transistor 82 is also electrically connected to ground through another 250 ohm resistor 100.

The voltage divider provided by the resistors 98 and 100 provides a fixed bias on the base of the transistor 82 of 7.5 volts. An input voltage on terminal 92 swinging from zero volts to three volts causes a variation in the base voltage of the transistor 74 of from 6 to 9 volts which provides 1.5 volts of noise signals at the input terminal 92 immunity. The operation of the transistors 74 and 82 is primarily that of the current switch. This makes very fast operation possible. The switching may take place within 20 nanoseconds.

Obviously, many modifications and variations of the invention are possible in the light of the above teachings. It is therefore to be understood that within the scope of the appended claims the invention may be practiced otherwise than as specifically described.

What is claimed is:

1. A delay line assembly for timing the control of the intensity of the sweep of a character generator display comprising:
- a delay-line assembly input terminal for receiving input signals which are to be delayed;
- a delay line having an input and an output;
- a first diode having its anode electrically connected to said delay line assembly input terminal and having its cathode electrically connected to a source of electrical potential;
- a delay-line assembly output terminal;
- a first PNP transistor having its emitter electrically connected to said delay-line assembly output terminal and having its collector electrically connected to a source of electrical potential;
- the base electrode of said first PNP transistor being electrically connected to the output of said delay line;
- a second diode having its anode electrically connected to said delay-line assembly output terminal and having its cathode electrically connected to the cathode of said first diode;
- a second PNP transistor having its collector grounded;
- a third PNP transistor having its collector electrically connected to the input of said delay line and to ground through a resistor having an impedance equal to the characteristic impedance of said delay line;
- the output end of said delay line being electrically connected to ground through a second resistor having a resistance equal to the characteristic impedance of said delay-line;

a third resistor being electrically connected to said delay-line assembly output terminal at one end and being electrically connected at its other end to the base of said second PNP transistor through a fourth resistor, to the emitter of said second and third PNP transistors through a fifth resistor, to the base of said third PNP transistor through a sixth resistor and being adapted to be electrically connected to a source of potential;

a seventh resistor electrically connected at one end to the base of said third PNP transistor and electrically connected at its other end to ground; and a capacitor having one plate electrically connected to the base of said third PNP transistor and having its other base electrically connected to ground.

2. A delay line assembly for timing the sweep of a character generator display in accordance with claim 1 wherein the delay line has a plurality of outputs and the base electrode of the first PNP transistor is electrically connected to one of said outputs of the delay line.

3. In a character-symbol display system having a plurality of character generation and control matrices for generating electrical control signals for deflecting an electron beam across the face of a cathode ray tube for drawing preselected characters and symbols and for generating a signal for controlling the intensity of the electron beam, the improvement comprising:

a first transistor having a base electrode electrically coupled to the intensity control output terminal of said character generation and control matrices and a collector electrode electrically connected to a source of reference potential;

a second transistor having a base electrode electrically connected to a source of reference potential, an emitter electrode electrically connected to the emitter of the first transistor and to a source of reference potential through first resistance means, and a collector electrode electrically connected to a source of reference potential through second resistance means; and a delay line having an input terminal and an output terminal;

the delay line input terminal being electrically connected to the collector electrode of the second transistor and the delay line output terminal being electrically coupled to the beam intensity control terminal of the cathode ray tube of the display system.

4. In a character-symbol display system having a plurality of character generation and control matrices for generating electrical control signals for deflecting an electron beam across the face of a cathode ray tube for drawing preselected characters and symbols and for generating a signal for controlling the intensity of the electron beam, the improvement of claim 3 wherein the delay line has a plurality of output terminals and the beam intensity control terminal of the cathode ray tube of the display system is electrically coupled to one of the output terminals of said delay line.

5. The character-symbol display system of claim 4 further comprising a third transistor having a base electrode electrically connected to one of the output terminals of the delay line, a collector electrode electrically connected to a source of reference potential, and an emitter electrode electrically connected to the beam intensity control terminal of the cathode ray tube of the system and to a source of reference potential through third resistance means, and the first resistance means is a potentiometer.

6. The display system of claim 5 further characterized in that a diode electrically connects the intensity control output terminal of the character generation and control matrices to a source of reference potential, a Zener diode couples said intensity control output terminal and the base electrode of the first transistor, and fourth resistance means electrically connects the base electrode of said first transistor to a reverse biasing potential for said Zener diode.

References Cited by the Examiner

UNITED STATES PATENTS

| | | | |
|---|---|---|---|
| 2,931,540 | 11/1959 | Luther | 330—55 X |
| 2,975,371 | 3/1961 | Greanias | 333—29 X |
| 3,042,873 | 7/1962 | Smith | 328—55 X |
| 3,093,798 | 6/1963 | Jacobsen | 328—55 X |
| 3,121,175 | 2/1964 | Vigneron | 330—24 X |
| 3,171,041 | 2/1965 | Haase. | |

ROY LAKE, *Primary Examiner.*

F. D. PARIS, E. C. FOLSOM, *Assistant Examiners.*